United States Patent
Yang et al.

(10) Patent No.: US 11,869,778 B2
(45) Date of Patent: Jan. 9, 2024

(54) LIQUID SUPPLY UNIT, AND APPARATUS AND METHOD FOR PROCESSING SUBSTRATE

(71) Applicant: SEMES CO., LTD., Chungcheongnam-do (KR)

(72) Inventors: Seungtae Yang, Gyeonggi-do (KR); Gi Hun Choi, Gyeongsangnam-do (KR); Buyoung Jung, Chungcheongnam-do (KR); Gui Su Park, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 484 days.

(21) Appl. No.: 17/137,233

(22) Filed: Dec. 29, 2020

(65) Prior Publication Data
US 2021/0202274 A1 Jul. 1, 2021

(30) Foreign Application Priority Data
Dec. 31, 2019 (KR) .......................... 10-2019-0179770

(51) Int. Cl.
*H01L 21/67* (2006.01)
*B08B 3/12* (2006.01)
(Continued)

(52) U.S. Cl.
CPC .......... *H01L 21/67051* (2013.01); *B08B 3/08* (2013.01); *B08B 3/12* (2013.01);
(Continued)

(58) Field of Classification Search
CPC ......... H01L 21/67051; H01L 21/68764; H01L 21/67017; H01L 21/6715; H01L 21/67;
(Continued)

(56) References Cited

U.S. PATENT DOCUMENTS

| 2005/0067101 A1* | 3/2005 | Funabashi | ......... H01L 21/67109 156/345.11 |
| 2013/0161266 A1* | 6/2013 | Chandran | ............... C02F 1/302 210/748.07 |
| 2013/0319457 A1* | 12/2013 | Lee | ................... H01L 21/67051 134/1 |

FOREIGN PATENT DOCUMENTS

| CN | 103447256 A | 12/2013 |
| JP | 06084874 A | 3/1994 |

(Continued)

OTHER PUBLICATIONS

Park et al., "Apparatus for supplying chemicals" May 2009, KR20090047251A—machine translation (Year: 2009).*

*Primary Examiner* — David G Cormier
*Assistant Examiner* — Thomas Bucci
(74) *Attorney, Agent, or Firm* — Procopio, Cory, Hargreaves & Savitch LLP

(57) ABSTRACT

An apparatus for processing a substrate includes a housing, a support unit that supports the substrate in the housing, a nozzle that dispenses a processing liquid onto the substrate, and a liquid supply unit that supplies the processing liquid to the nozzle. The liquid supply unit includes a container having a storage space in which the processing liquid is stored, a liquid supply tube through which the processing liquid flows from the container to the nozzle, and an ultrasonic-wave application member that applies ultrasonic waves to the processing liquid before the processing liquid is supplied to the nozzle. The ultrasonic-wave application member includes a liquid reservoir having an interior space in which a liquid is received and an ultrasonic generator that applies ultrasonic waves to the liquid received in the liquid reservoir. Part of the liquid supply tube is immersed in the liquid received in the liquid reservoir.

9 Claims, 11 Drawing Sheets

(51) Int. Cl.
    *B08B 3/08*     (2006.01)
    *H01L 21/687*     (2006.01)
    *C02F 9/00*     (2023.01)
    *C02F 1/00*     (2023.01)
    *C02F 1/36*     (2023.01)
    *C02F 1/48*     (2023.01)

(52) U.S. Cl.
    CPC .......... *C02F 9/00* (2013.01); *H01L 21/68764* (2013.01); *C02F 1/001* (2013.01); *C02F 1/36* (2013.01); *C02F 1/484* (2013.01)

(58) Field of Classification Search
    CPC ....... H01L 21/67034; B08B 3/08; B08B 3/12; B08B 2203/0288; B01D 37/00; B01D 35/06; B01J 19/10; C02F 9/00; C02F 1/001; C02F 1/36; C02F 1/484; C02F 1/48

USPC ...................................................... 134/58 R
    See application file for complete search history.

(56)               References Cited

FOREIGN PATENT DOCUMENTS

| | | |
|---|---|---|
| JP | 11285673 A | 10/1999 |
| JP | 2003093984 A | 4/2003 |
| JP | 2008171956 A | 7/2008 |
| JP | 2014165349 A | 9/2014 |
| KR | 10-2003-0021581 A | 3/2003 |
| KR | 10-2008-0011792 A | 2/2008 |
| KR | 1020080104990 A | 12/2008 |
| KR | 20090047251 A * | 5/2009 |
| KR | 1020090047251 A | 5/2009 |
| KR | 10-1043863 B1 | 6/2011 |

* cited by examiner

LIQUID SUPPLY UNIT, AND APPARATUS AND METHOD FOR PROCESSING SUBSTRATE

CROSS-REFERENCE TO RELATED APPLICATIONS

A claim for priority under 35 U.S.C. § 119 is made to Korean Patent Application No. 10-2019-0179770 filed on Dec. 31, 2019, in the Korean Intellectual Property Office, the entire contents of which are hereby incorporated by reference.

BACKGROUND

Embodiments of the inventive concept described herein relate to a liquid supply unit and an apparatus and method for processing a substrate, and more particularly, relate to a liquid supply unit for processing a substrate with a liquid by dispensing the liquid onto the substrate, and a substrate processing apparatus and method using the liquid supply unit.

Various processes, such as photolithography, deposition, ashing, etching, ion implantation, and the like, are performed to manufacture semiconductor elements. In some of the processes, a processing liquid is dispensed onto a substrate to perform liquid treatment on the substrate.

In a process of dispensing the processing liquid onto the substrate, impurities generated from a liquid supply tube for supplying the processing liquid, a liquid reservoir, a nozzle, and the like may be supplied to the substrate. Accordingly, a filter is installed in the liquid supply tube to remove the impurities.

However, there is a limitation in the sizes of impurities that can be filtered by the filter, and therefore fine impurities may be supplied to the substrate without being filtered by the filter.

SUMMARY

Embodiments of the inventive concept provide a liquid supply unit for effectively aggregating and removing impurities in a processing liquid, and a substrate processing apparatus and method using the liquid supply unit.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for processing a substrate includes a housing having a processing space inside, a support unit that supports the substrate in the housing, a nozzle that dispenses a processing liquid onto the substrate supported on the support unit, and a liquid supply unit that supplies the processing liquid to the nozzle. The liquid supply unit includes a container having a storage space in which the processing liquid is stored, a liquid supply tube through which the processing liquid flows from the container to the nozzle, and an ultrasonic-wave application member that applies ultrasonic waves to the processing liquid before the processing liquid is supplied to the nozzle. The ultrasonic-wave application member includes a liquid reservoir having an interior space in which a liquid is received and an ultrasonic generator that applies ultrasonic waves to the liquid received in the liquid reservoir. Part of the liquid supply tube is immersed in the liquid received in the liquid reservoir.

According to an embodiment, in an area immersed in the liquid received in the liquid reservoir, the part of the liquid supply tube may be provided in a zigzag form.

According to an embodiment, in an area immersed in the liquid received in the liquid reservoir, the part of the liquid supply tube may be provided in a coil form.

According to an embodiment, the apparatus may further include a filter that is installed in the liquid supply tube and that filters impurities from the processing liquid to be supplied to the nozzle, and the ultrasonic-wave application member may be disposed upstream of the filter.

According to an embodiment, the apparatus may further include an electromagnetic field generator that generates an electromagnetic field in the liquid supply tube.

According to an embodiment, the electromagnetic field generator may be provided downstream of the ultrasonic generator.

According to an embodiment, an area of the liquid supply tube that is immersed in the liquid received in the liquid reservoir may include a first tubular portion through which the processing liquid flows upward, a second tubular portion that is connected to the first tubular portion and through which the processing liquid flows in a direction perpendicular to the first tubular portion, and a third tubular portion that is connected to the second tubular portion and through which the processing liquid flows downward, and an electromagnetic field generator may be provided on the third tubular portion.

According to an embodiment, the processing liquid may include a chemical or an organic solvent.

According to an exemplary embodiment, a liquid supply unit includes a container having a storage space in which a processing liquid is stored, a liquid supply tube through which the processing liquid flows from the container to a nozzle, and an ultrasonic-wave application member that applies ultrasonic waves to the processing liquid before the processing liquid is supplied to the nozzle. The ultrasonic-wave application member includes a liquid reservoir having an interior space in which a liquid is received and an ultrasonic generator that applies ultrasonic waves to the liquid received in the liquid reservoir. Part of the liquid supply tube is immersed in the liquid received in the liquid reservoir.

According to an embodiment, the part of the liquid supply tube immersed in the liquid received in the liquid reservoir may be provided in a zigzag form.

According to an embodiment, the liquid supply unit may further include a filter that is installed in the liquid supply tube and that filters impurities from the processing liquid to be supplied to the nozzle, and the ultrasonic-wave application member may be disposed upstream of the filter.

According to an embodiment, the liquid supply unit may further include an electromagnetic field generator that generates an electromagnetic field in the liquid supply tube.

According to an embodiment, the processing liquid may include a chemical or an organic solvent, the chemical may be sulfuric acid, hydrofluoric acid, or a mixture thereof, and the organic solvent may be isopropyl alcohol.

According to an exemplary embodiment, a method for processing a substrate with a processing liquid includes aggregating and removing impurities in the processing liquid while the processing liquid is dispensed onto the substrate. A liquid supply tube through which the processing liquid flows is immersed in a liquid received in a liquid reservoir, and ultrasonic waves are applied to the liquid to aggregate the impurities.

According to an embodiment, the aggregated impurities may be removed by a filter.

According to an embodiment, the aggregated impurities may be removed by providing an electromagnetic field to a path along which the processing fluid flows.

According to an embodiment, the electromagnetic field may be provided downstream of an area of the liquid supply tube where the ultrasonic waves are applied to the processing liquid.

According to an embodiment, the processing liquid may include a chemical or an organic solvent, the chemical may be sulfuric acid, hydrofluoric acid, or a mixture thereof, and the organic solvent may be isopropyl alcohol.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
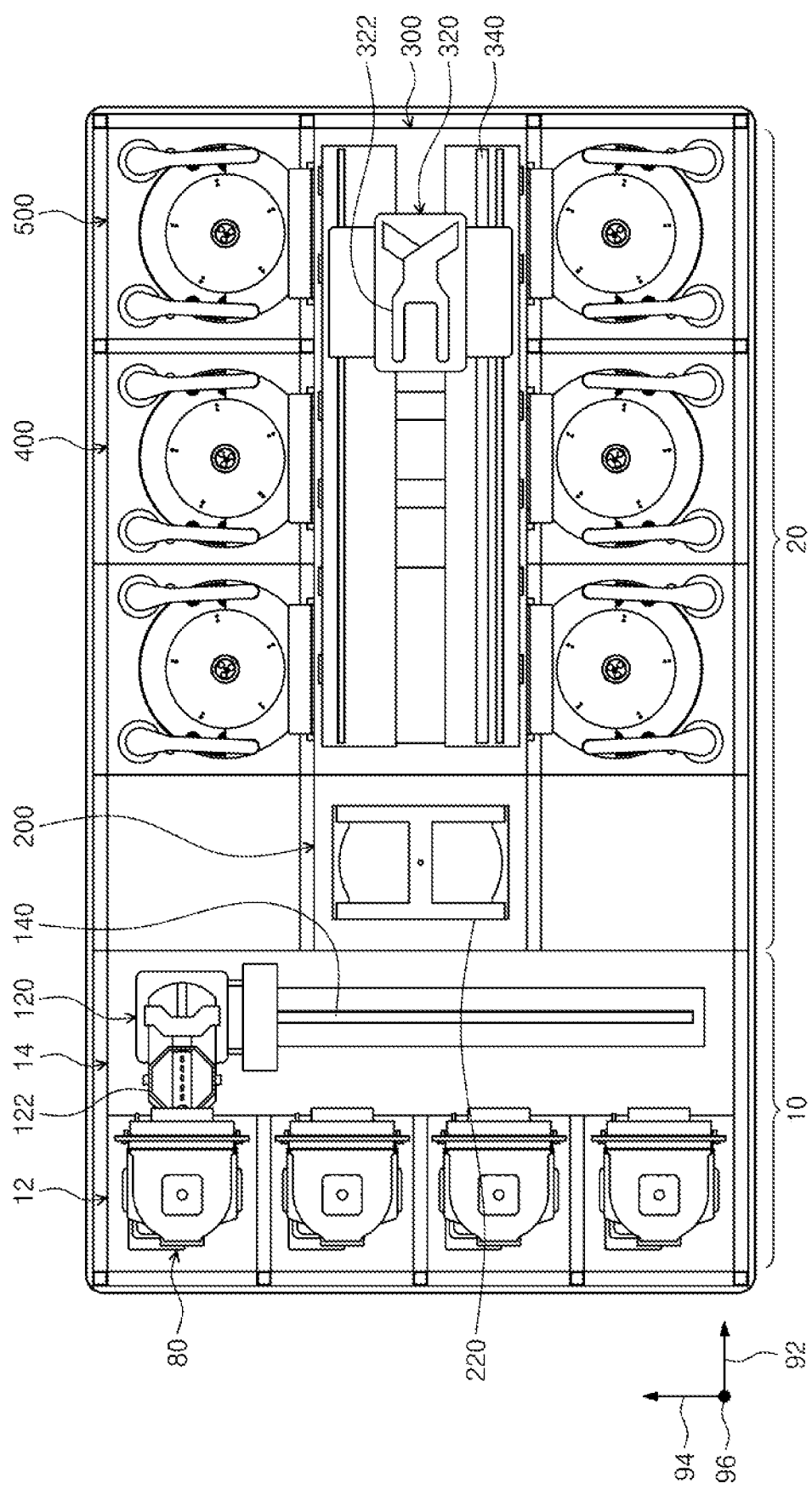
FIG. 1 is a schematic plan view illustrating a substrate processing apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

In this embodiment, a cleaning process of processing a substrate with a chemical and a rinsing solution will be described as an example. Without being limited thereto, however, this embodiment is applicable to a process (e.g., an etching process, an ashing process, a developing process, or the like) of processing a substrate using a processing liquid.

FIG. 1 is a schematic plan view illustrating a substrate processing apparatus according to an embodiment of the inventive concept. Referring to FIG. 1, the substrate processing apparatus includes an index module 10 and a process module 20. According to an embodiment, the index module 10 and the process module 20 are disposed along one direction. Hereinafter, a direction in which the index module 10 and the process module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from carriers 80 to the process module 20 and carries the substrates W completely processed in the process module 20 into the carriers 80. The index module 10 is disposed such that the lengthwise direction thereof is parallel to the second direction 94. The index module 10 has load ports 12 and an index frame 14. The load ports 12 are located on the opposite side to the process module 20 with respect to the index frame 14. The carriers 80, each of which has the substrates W received therein, are placed on the load ports 12. The load ports 12 may be disposed along the second direction 94.

Airtight carriers, such as front open unified pods (FOUPs), may be used as the carriers 80. The carriers 80 may be placed on the load ports 12 by a transfer unit (not illustrated), such as an overhead transfer, an overhead conveyor, or an automatic guided vehicle, or by an operator.

An index robot 120 is provided in the index frame 14. A guide rail 140, the lengthwise direction of which is parallel to the second direction 94, is provided in the index frame 14. The index robot 120 is movable on the guide rail 140. The index robot 120 includes hands 122 on which the substrates W are placed. The hands 122 are movable forward and backward, rotatable about an axis facing the third direction 96, and movable along the third direction 96. The hands 122 may be spaced apart from each other in an up/down direction. The hands 122 may independently move forward and backward.

The process module 20 includes a buffer unit 200, a transfer chamber 300, and liquid treatment chambers 400. The buffer unit 200 provides a space in which the substrates W carried into the process module 20 and the substrates W to be carried out of the process module 20 temporarily stay. Each of the liquid treatment chambers 400 performs liquid treatment on the substrate W by dispensing liquids onto the substrate W. The transfer chamber 300 transfers the substrates W between the buffer unit 200 and the liquid treatment chambers 400.

The transfer chamber 300 may be disposed such that the lengthwise direction thereof is parallel to the first direction 92. The buffer unit 200 may be disposed between the index module 10 and the transfer chamber 300. The liquid treatment chambers 400 may be disposed on opposite sides of the transfer chamber 300. The liquid treatment chambers 400 and the transfer chamber 300 may be disposed along the second direction 94. The buffer unit 200 may be located at one end of the transfer chamber 300.

According to an embodiment, on the opposite sides of the transfer chamber 300, the liquid treatment chambers 400 may be arranged in an A x B array (A and B being natural numbers of 1 or larger) along the first direction 92 and the third direction 96.

The transfer chamber 300 has a transfer robot 320. A guide rail 340, the lengthwise direction of which is parallel to the first direction 92, may be provided in the transfer chamber 300, and the transfer robot 320 is movable along the guide rail 340. The transfer robot 320 includes hands 322 on which the substrates W are placed. The hands 322 are movable forward and backward, rotatable about an axis facing the third direction 96, and movable along the third direction 96. The hands 322 may be spaced apart from each other in the up/down direction. The hands 322 may independently move forward and backward.

The buffer unit 200 includes a plurality of buffers 220 in which the substrates W are placed. The buffers 220 may be spaced apart from each other along the third direction 96. A front face and a rear face of the buffer unit 200 are open. The front face is a face that faces the index module 10, and the rear face is a face that faces the transfer chamber 300. The index robot 120 may approach the buffer unit 200 through the front face, and the transfer robot 320 may approach the buffer unit 200 through the rear face.

Figure 2:
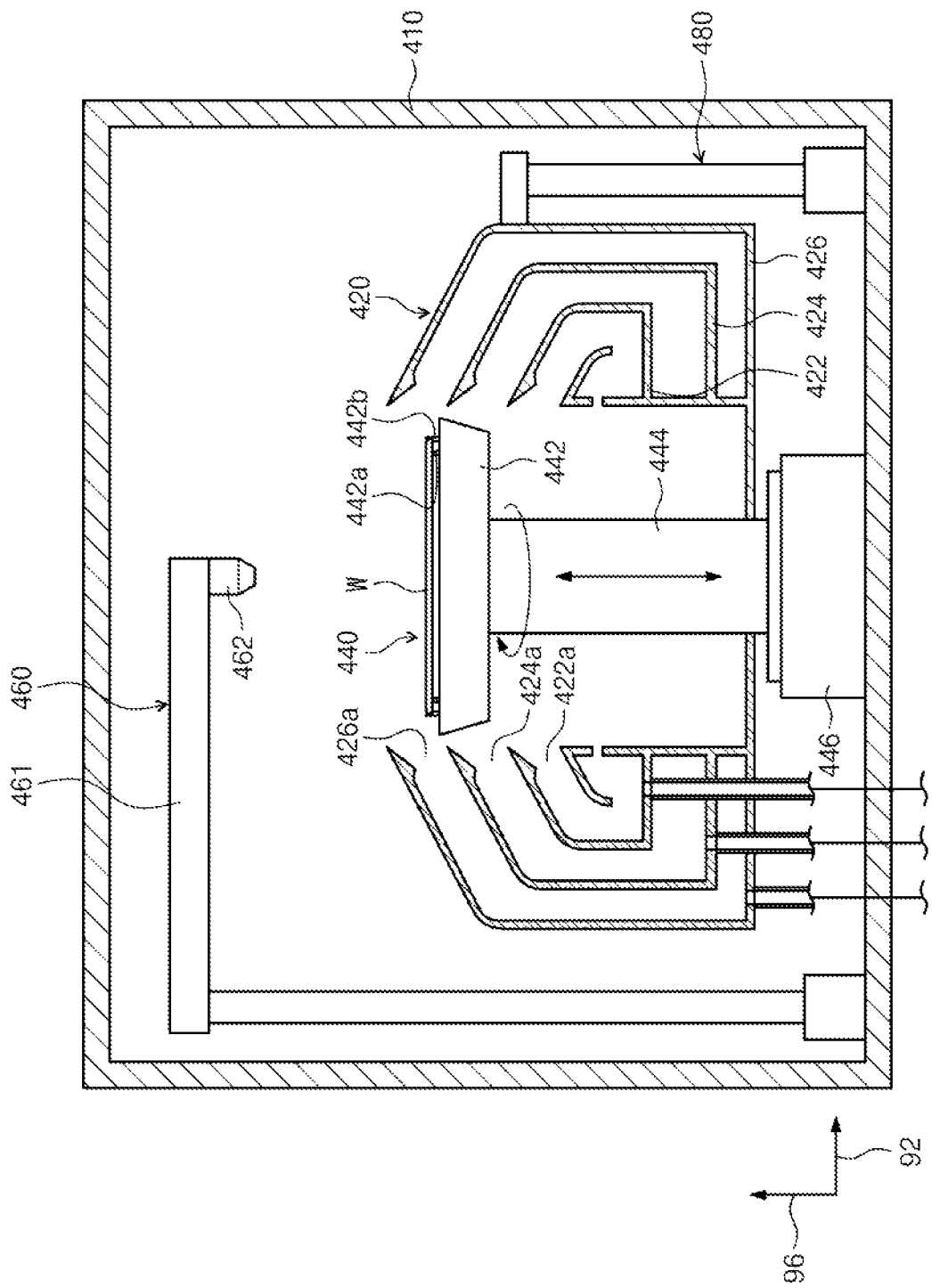
FIG. 2 is a schematic view illustrating one embodiment of liquid treatment chambers of FIG. 1.

FIG. 2 is a schematic view illustrating one embodiment of the liquid treatment chambers 400 of FIG. 1. Referring to FIG. 2, the liquid treatment chamber 400 has a housing 410, a cup 420, a support unit 440, liquid dispensing units 460, and a lifting unit 480.

The housing 410 has a substantially rectangular parallelepiped shape. The cup 420, the support unit 440, and the liquid dispensing units 460 are disposed in the housing 410.

The cup 420 has a processing space that is open at the top, and the substrate W is processed with liquids in the processing space. The support unit 440 supports the substrate W in the processing space. The liquid dispensing units 460 dispense the liquids onto the substrate W supported on the support unit 440. The liquids may be sequentially dispensed onto the substrate W. The lifting unit 480 adjusts the height of the cup 420 relative to the support unit 440.

According to an embodiment, the cup 420 has a plurality of recovery bowls 422, 424, and 426. The recovery bowls 422, 424, and 426 have recovery spaces for recovering the liquids used to process the substrate W. The recovery bowls 422, 424, and 426 have a ring shape that surrounds the support unit 440. The processing liquids scattered by rotation of the substrate W during a liquid treatment process may be introduced into the recovery spaces through inlets 422a, 424a, and 426a of the respective recovery bowls 422, 424, and 426.

According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a drive shaft 444. An upper surface of the support plate 442 may have a substantially circular shape and may have a larger diameter than the substrate W. Support pins 442a are provided on a central portion of the support plate 442 to support a rear surface of the substrate W. The support pins 442a protrude upward from the support plate 442 to space the substrate W apart from the support plate 442 by a predetermined distance.

Chuck pins 442b are provided on an edge portion of the support plate 442. The chuck pins 442b protrude upward from the support plate 442 and support a lateral portion of the substrate W to prevent the substrate W from escaping from the support unit 440 when being rotated. The drive shaft 444 is driven by an actuator 446. The drive shaft 444 is connected to the center of a rear surface of the support plate 442 and rotates the support plate 442 about the central axis thereof.

The lifting unit 480 moves the cup 420 in the vertical direction. The height of the cup 420 relative to the substrate W is changed by the vertical movement of the cup 420. Accordingly, the recovery bowls 422, 424, and 426 for recovering the processing liquids may be changed depending on the types of liquids dispensed onto the substrate W, and thus the liquids may be separately recovered. Unlike the above description, the cup 420 may be fixed, and the lifting unit 480 may move the support unit 440 in the vertical direction.

The liquid dispensing units 460 dispense the processing liquids onto the substrate W. The liquid dispensing units 460 include arms 461 and nozzles 462 that are fixedly coupled to ends of the arms 461 and that dispense the liquids onto the substrate W.

According to an embodiment, the liquid dispensing units 460 may dispense different types of processing liquids onto the substrate W. The processing liquids may include a chemical, a rinsing solution, and an organic solvent. The chemical may include diluted sulfuric acid ($H_2SO_4$), phosphoric acid ($P_2O_5$), hydrofluoric acid (HF), and ammonium hydroxide ($NH_4OH$). Furthermore, the chemical may be a mixture of sulfuric acid and hydrofluoric acid. The organic solvent may be isopropyl alcohol (IPA). The rinsing solution may be deionized water (DIW). Liquid supply units 500 supply the processing liquids to the liquid dispensing units 460.

Hereinafter, embodiments of the inventive concept will be described in detail with reference to FIGS. 3 to 5.

Figure 3:
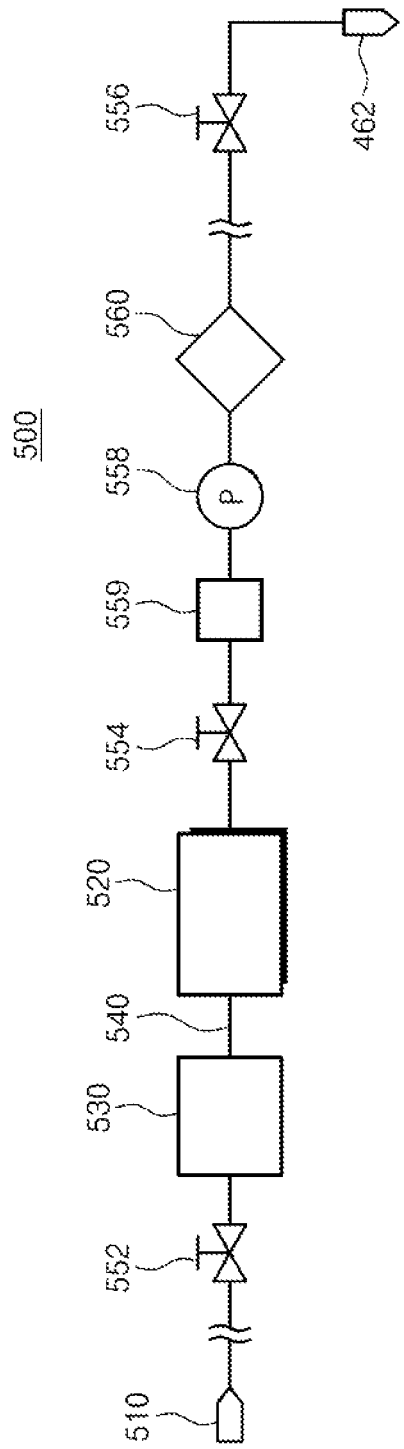
FIG. 3 is a schematic view illustrating a liquid supply unit according to an embodiment of the inventive concept.
Figure 4:
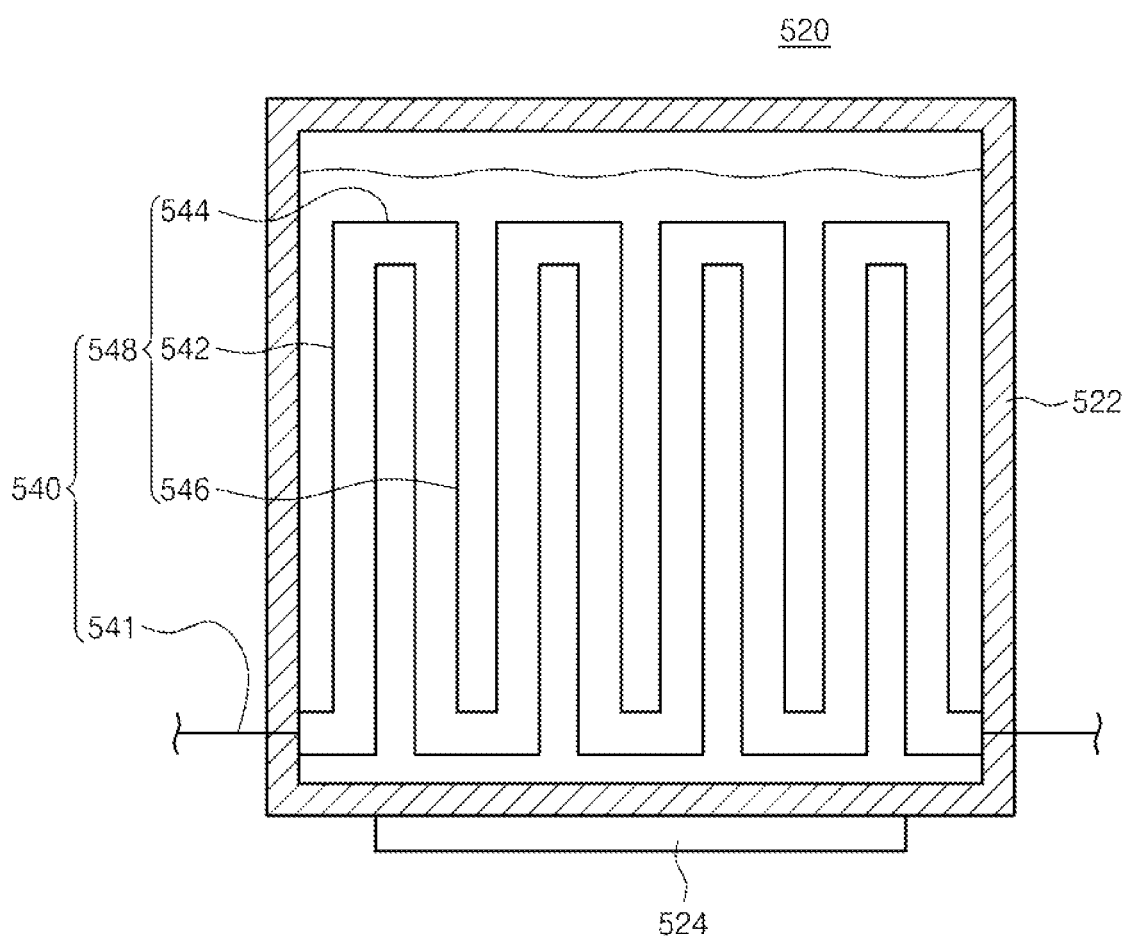
FIGS. 4 and 5 are views illustrating ultrasonic-wave application members according to one embodiment and another embodiment of the inventive concept.
Figure 5:
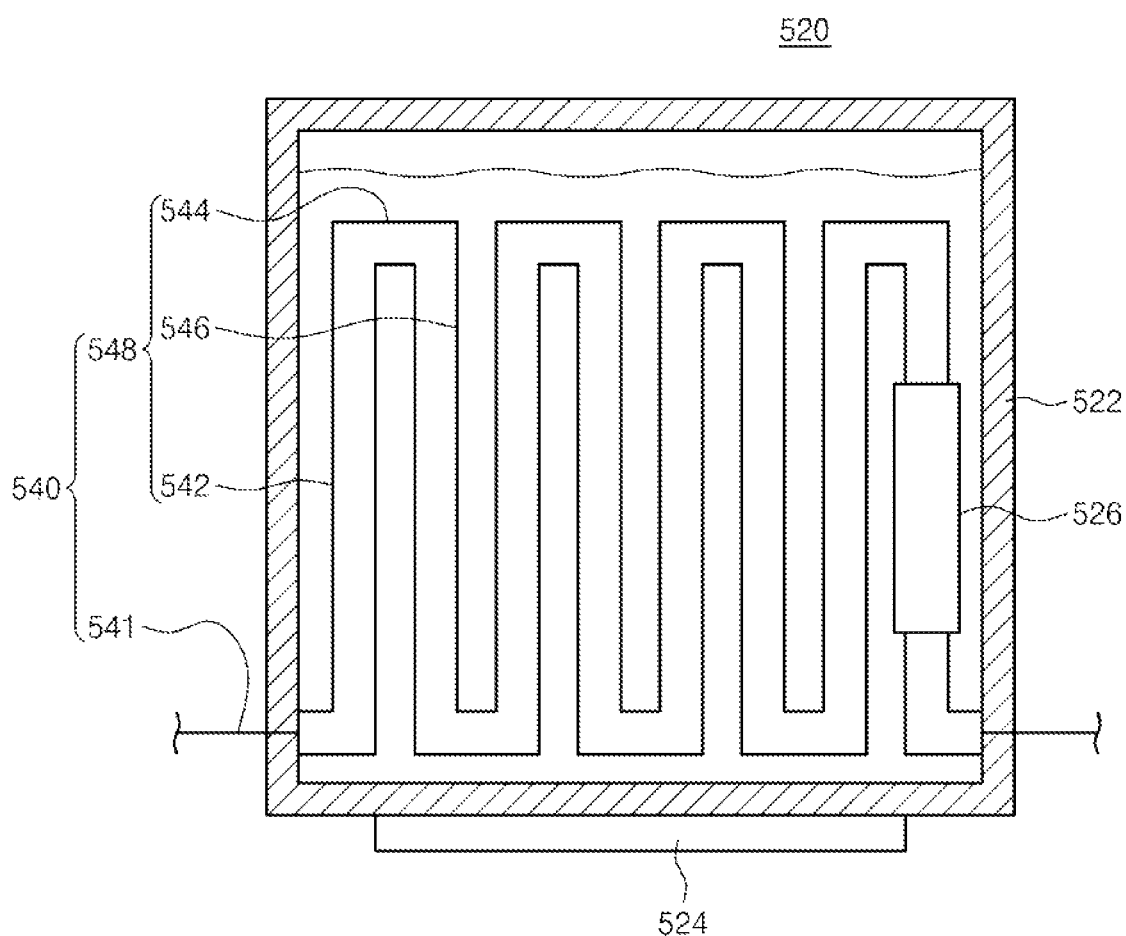

FIG. 3 is a schematic view illustrating a liquid supply unit according to an embodiment of the inventive concept, and FIGS. 4 and 5 are views illustrating ultrasonic-wave application members according to one embodiment and another embodiment of the inventive concept.

As described above, the processing liquids dispensed by the liquid dispensing units 460 may include a chemical, a rinsing solution, and an organic solvent. The chemical may include sulfuric acid, hydrofluoric acid, or a mixture thereof. The organic solvent may be isopropyl alcohol (IPA). In the following embodiments, it will be exemplified that the chemical is dispensed onto the substrate W and the chemical includes sulfuric acid, hydrofluoric acid, or a mixture thereof.

Referring to FIG. 3, the liquid supply unit 500 may include a processing liquid supply source 510, a container 530, a liquid supply tube 540, a filter 560, and an ultrasonic-wave application member 520.

The processing liquid supply source 510 supplies the chemical to the container 530. The processing liquid supply source 510, the container 530, and the nozzle 462 are connected by the liquid supply tube 540, and a first valve 552, a second valve 554, and a third valve 556 are installed in the liquid supply tube 540. The first valve 552, the second valve 554, and the third valve 556 may be opening/shutting valves or flow-rate control valves.

The first valve 552 regulates the flow rate of the chemical that is supplied from the processing liquid supply source 510 to the container 530. The second valve 554 regulates the flow rate of the chemical that is supplied from the container 530 to the filter 560. The third valve 556 regulates the flow rate of the chemical that is dispensed onto the substrate W through the nozzle 462. The container 530 receives the chemical from the processing liquid supply source 510 and stores the chemical. The chemical in the container 530 is supplied to the nozzle 462.

In an embodiment, the second valve 554 and a flow meter 559 may be installed in the liquid supply tube 540. The second valve 554 may regulate the flow rate of the chemical supplied from the container 530. The second valve 554 may be an opening/shutting valve or a flow-rate control valve. The flow meter 559 may directly or indirectly measure the flow rate of the chemical flowing through the liquid supply tube 540.

According to an embodiment, the filter 560 is disposed downstream of the ultrasonic-wave application member 520, the second valve 554, a pump 558, and the flow meter 559. Accordingly, impurities generated when the chemical passes through the second valve 554, the pump 558, or the flow meter 559 and impurities aggregated in the ultrasonic-wave application member 520 may be filtered by the filter 560.

Referring to FIG. 4, the ultrasonic-wave application member 520 includes a liquid reservoir 522 and an ultrasonic generator 524. The liquid reservoir 522 has an interior space in which a liquid is received. In an embodiment, the interior space of the liquid reservoir 522 is sealed from the outside. Accordingly, a reduction in the level of the liquid due to evaporation of the liquid in the liquid reservoir 522 may be prevented. Selectively, the liquid reservoir 522 may be provided in a shape that is open at the top. In an embodiment, the liquid received in the liquid reservoir 522 is water. Part of the liquid supply tube 540 is immersed in the liquid received in the interior space of the liquid reservoir 522.

The ultrasonic generator 524 applies ultrasonic waves to the liquid received in the liquid reservoir 522. The ultrasonic waves are applied to the inside of the liquid supply tube 540, the part of which is immersed in the liquid in the liquid reservoir 522. In an embodiment, in an area 548 immersed in the liquid received in the liquid reservoir 522, the part of the liquid supply tube 540 is provided in a zigzag form.

Referring to FIG. 5, the ultrasonic-wave application member 520 may include an electromagnetic field generator 526. In an embodiment, the area 548 of the liquid supply tube 540 that is immersed in the liquid received in the liquid reservoir 522 includes first tubular portions 542, second tubular portions 544, and third tubular portions 546. The first tubular portions 542 are provided such that the chemical flows upward through the first tubular portions 542. The second tubular portions 544 are connected to the first tubular portions 542 and are provided such that the chemical flows in a direction perpendicular to the first tubular portions 542 through the second tubular portions 544. The third tubular portions 546 are connected to the second tubular portions 544 and are provided such that the chemical flows downward through the third tubular portions 546. In an embodiment, the electromagnetic field generator 526 is provided on one of the third tubular portions 546.

Figure 6:
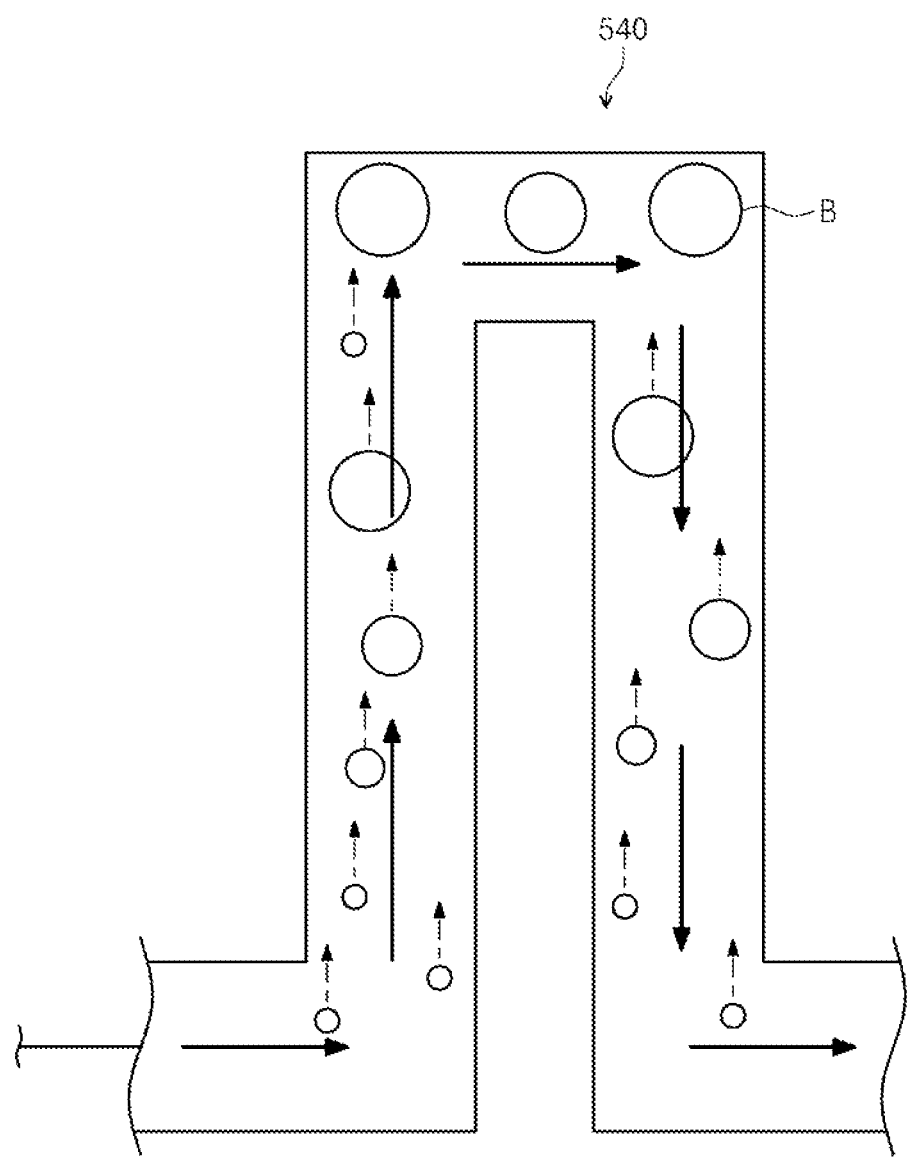
FIGS. 6 to 8 are views illustrating a substrate processing method in sequence according to an embodiment of the inventive concept.
Figure 7:
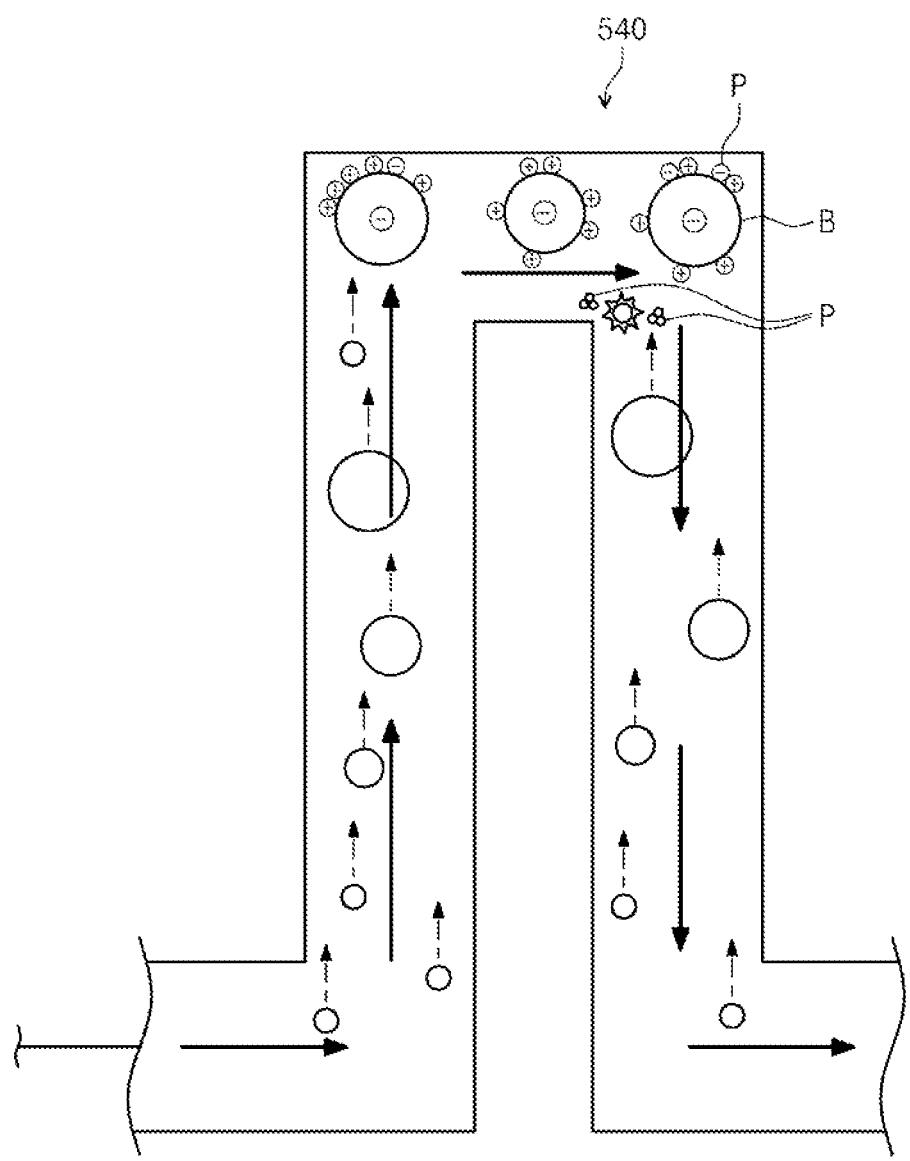
Figure 8:
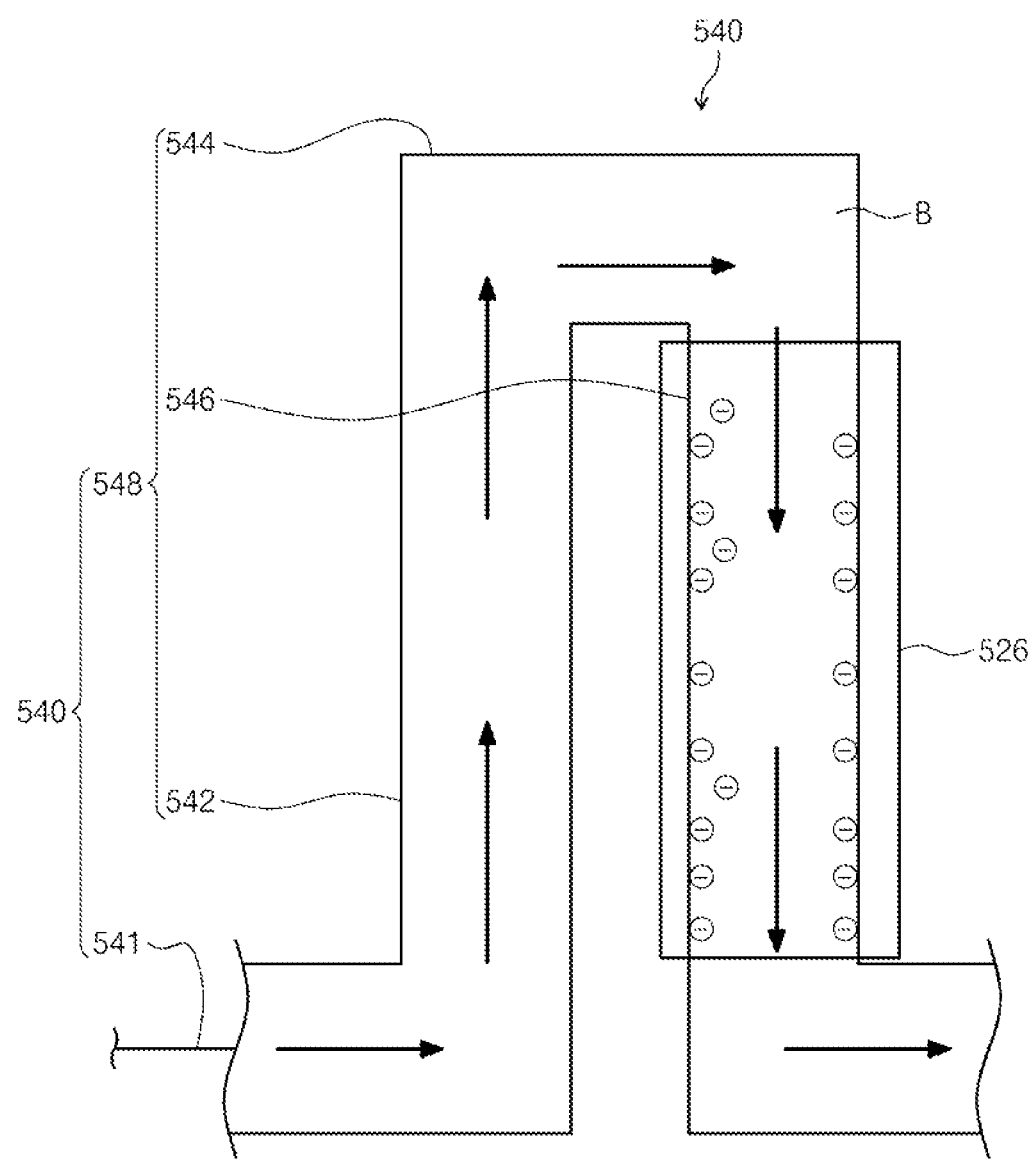

Hereinafter, a substrate processing method of the inventive concept will be described in detail with reference to FIGS. 6 and 7. First, the chemical is supplied from the processing liquid supply source 510 to the liquid supply tube 540. Next, the ultrasonic generator 524 applies ultrasonic waves to the chemical. When the ultrasonic waves are applied to the chemical, bubbles B are generated in the chemical as illustrated in FIG. 6. The bubbles B generated in the liquid supply tube 540 are moved upward in the liquid supply tube 540. After the bubbles B are generated in the chemical, the bubbles B and impurities P collide with each other, and in this process, the impurities P are aggregated around the bubbles B.

In an embodiment, the impurities P generated from the sulfuric acid, the hydrofluoric acid, or the mixture thereof are mainly positively charged, and the bubbles B are negatively charged. Therefore, the impurities P are aggregated around the bubbles B. After the positively charged impurities P are aggregated around the negatively charged bubbles B, negatively charged impurities P are also aggregated together. Thus, the impurities P are aggregated to a size that can be filtered by the filter 560.

Some of the bubbles B generated in the chemical collapse before moving to an upper portion of the liquid supply tube 540. Collapse energy of the bubbles B is generated around the regions in which the bubbles B collapse. Due to this, hot spots where temperature is locally raised due to impact applied to the chemical or adiabatic expansion of the chemical are formed. Due to the high-temperature and high-pressure environment of the hot spots, the impurities P are actively aggregated around the hot spots. Thus, the impurities P are aggregated within a short time.

The aggregated impurities P are removed by the filter 560. In an embodiment, before removed by the filter 560, the aggregated impurities P may be removed by providing an electromagnetic field to a path along which the chemical flows. For example, the electromagnetic field generator 526 is provided on one of the third tubular portions 546. In a case where the bubbles B are mainly negatively charged, positive charges are applied to the electromagnetic field generator 526, and the bubbles B are captured by the electromagnetic field generator 526. The positively charged impurities P are aggregated to the negatively charged impurities P and captured together with the bubbles B by the electromagnetic field generator 526.

While the chemical is dispensed onto the substrate W, electric power may be supplied to the electromagnetic field generator 526 to capture the impurities P, and while the chemical is not dispensed onto the substrate W, the electromagnetic field generator 526 may be de-energized. The bubbles B are moved upward in the liquid supply tube 540 due to the nature thereof. The bubbles B are moved at the lowest speed in the third tubular portions 546 where the direction in which the chemical flows is different from the direction in which the bubbles B are moved. Therefore, the electromagnetic field generator 526 is installed on one of the third tubular portions 536 to facilitate capturing the impurities B aggregated around the bubbles B.

Figure 9:
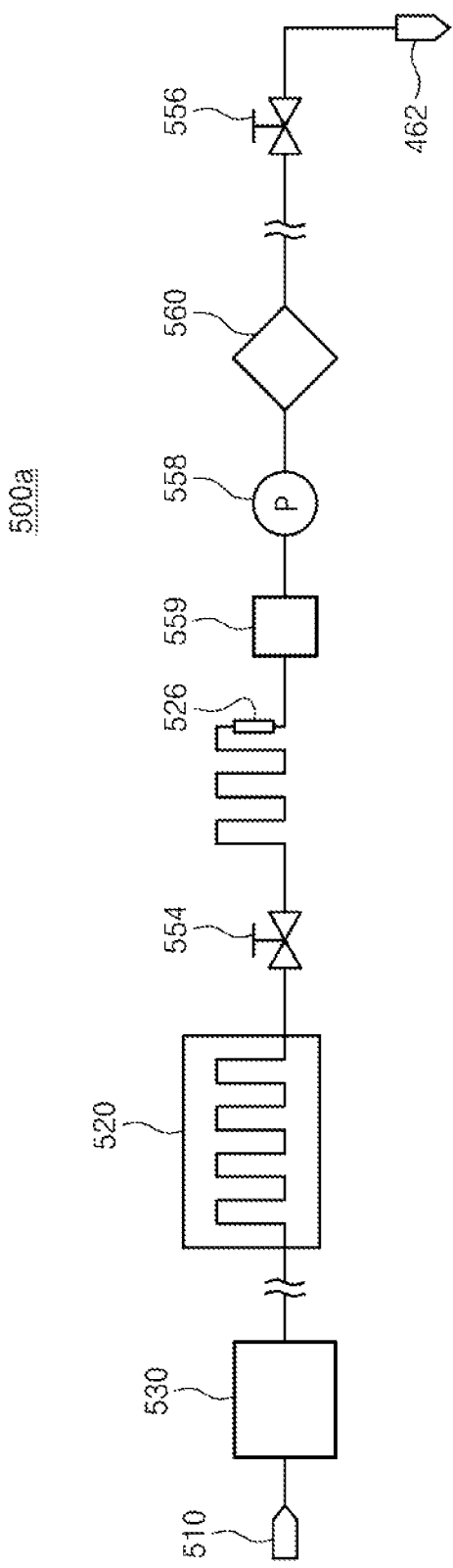
FIGS. 9 and 10 are schematic views illustrating liquid supply units according to other embodiments of the inventive concept.

In the above-described embodiment, it has been described that the electromagnetic field generator 526 is provided in the ultrasonic-wave application member 520. However, in another embodiment, as illustrated in FIG. 9, the electromagnetic field generator 526 may be provided downstream of the ultrasonic-wave application member 520. Accordingly, impurities P aggregated by bubbles B generated by the ultrasonic-wave application member 520 may be captured.

Figure 10:
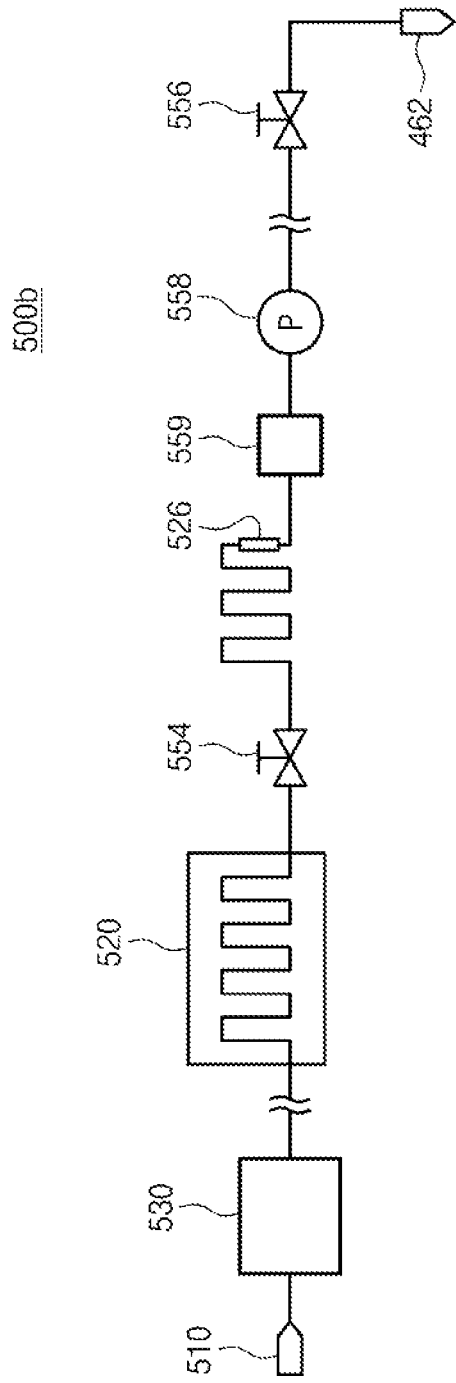

In the above-described embodiment, it has been described that the liquid supply unit 500 of the inventive concept includes both the electromagnetic field generator 526 and the filter 560. However, in another embodiment, as illustrated in FIG. 10, a liquid supply unit may not include the filter 560. For example, the electromagnetic field generator 526 is provided downstream of the ultrasonic generator 524 and captures impurities P aggregated by bubbles B. While the chemical is dispensed onto the substrate W, electric power is supplied to the electromagnetic field generator 526 to capture the impurities P, and while the chemical is not dispensed onto the substrate W, the electromagnetic field generator 526 is de-energized. After the electromagnetic field generator 526 is de-energized, the impurities P floating in the chemical may be removed by performing pre-dispensing.

Figure 11:
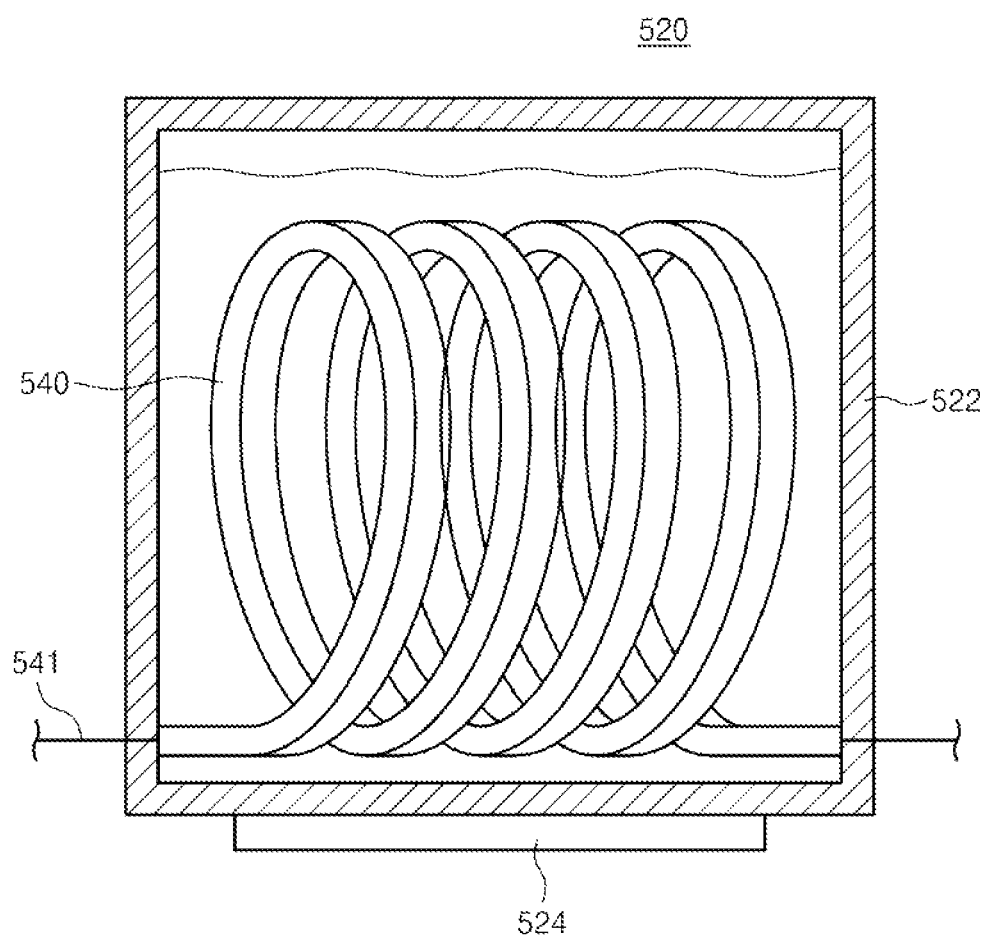
FIG. 11 is a view illustrating an ultrasonic-wave application member according to another embodiment of the inventive concept.

In the above-described embodiment, it has been described that in the area 548 immersed in the liquid received in the liquid reservoir 522, the part of the liquid supply tube 540 is provided in the zigzag form. However, in another embodiment, as illustrated in FIG. 11, part of the liquid supply tube 540 may be provided in a coil form in the area 548 immersed in the liquid received in the liquid reservoir 522.

In the above-described embodiment, the ultrasonic generator 524 has been illustrated as being attached to a lower portion of an outer wall of the liquid reservoir 522. However, in another embodiment, the ultrasonic generator 524 may be attached to an upper portion or a lateral portion of the outer wall of the liquid reservoir 522, or may be provided inside the liquid reservoir 522, to apply ultrasonic waves to the inside of the liquid reservoir 522.

In the above-described embodiment, it has been exemplified that ultrasonic waves are applied to the liquid received in the liquid reservoir 522 and are transmitted to the chemical through the liquid. However, the inventive concept is not limited thereto. An ultrasonic-wave application member according to another embodiment may include a tank having a receiving space and a probe for generating ultrasonic waves. The probe may be provided in the receiving space of the tank. The chemical may be supplied into the receiving space of the tank. In this case, the probe provided in the receiving space may directly apply ultrasonic waves to the chemical supplied into the receiving space. Accordingly, the ultrasonic-wave application member according to the other embodiment may further improve efficiency in removing impurities P floating in the chemical.

According to the inventive concept, the ultrasonic-wave application member 520 is disposed upstream of the filter 560. Accordingly, before the chemical flowing through the liquid supply tube 540 reaches the filter 560, impurities are aggregated in the chemical and become larger in size. As described above, the impurities in the chemical are aggregated in front of the filter 560 and filtered by the filter 560. Accordingly, a circulation path of the chemical may be reduced or omitted.

According to the inventive concept, the area 548 of the liquid supply tube 540 that is immersed in the liquid received in the liquid reservoir 522 is provided in the zigzag form or the coil form. Accordingly, the surface area of the liquid supply tube 540 to which ultrasonic waves are applied may be increased, and thus bubbles B may be easily generated.

According to the embodiments of the inventive concept, impurities in a processing liquid may be effectively aggregated and removed.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
a housing having a processing space inside;
a support unit configured to support the substrate in the housing;
a nozzle configured to dispense a processing liquid onto the substrate supported on the support unit; and
a liquid supply unit configured to supply the processing liquid to the nozzle, wherein the liquid supply unit includes:
a container having a storage space in which the processing liquid is stored;
a liquid supply tube through which the processing liquid flows from the container to the nozzle; and
an ultrasonic-wave application member configured to apply ultrasonic waves to the processing liquid before the processing liquid is supplied to the nozzle,
wherein the ultrasonic-wave application member includes:
a liquid reservoir having an interior space in which a liquid is received;
an ultrasonic generator configured to apply ultrasonic waves to the liquid received in the liquid reservoir; and
an electromagnetic field generator configured to generate an electromagnetic field in the liquid supply tube,
wherein part of the liquid supply tube is immersed in the liquid received in the liquid reservoir and the electromagnetic field generator is provided in the liquid reservoir,
wherein an area of the liquid supply tube that is immersed in the liquid received in the liquid reservoir includes:
a first tubular portion through which the processing liquid flows upward;
a second tubular portion that is connected to the first tubular portion and through which the processing liquid flows in a direction perpendicular to the first tubular portion; and
a third tubular portion that is connected to the second tubular portion and through which the processing liquid flows downward, and
wherein the electromagnetic field generator is disposed only on the third tubular portion.

2. The apparatus of claim 1, wherein in an area immersed in the liquid received in the liquid reservoir, the part of the liquid supply tube is provided in a zigzag form.

3. The apparatus of claim 1, wherein in an area immersed in the liquid received in the liquid reservoir, the part of the liquid supply tube is provided in a coil form.

4. The apparatus of claim 1, further comprising:
a filter installed in the liquid supply tube and configured to filter impurities from the processing liquid to be supplied to the nozzle,
wherein the ultrasonic-wave application member is disposed upstream of the filter.

5. The apparatus of claim 1, wherein the processing liquid includes a chemical or an organic solvent.

6. A liquid supply unit comprising:
   a container having a storage space in which a processing liquid is stored;
   a liquid supply tube through which the processing liquid flows from the container to a nozzle; and
   an ultrasonic-wave application member configured to apply ultrasonic waves to the processing liquid before the processing liquid is supplied to the nozzle,
   wherein the ultrasonic-wave application member includes:
   a liquid reservoir having an interior space in which a liquid is received;
   an ultrasonic generator configured to apply ultrasonic waves to the liquid received in the liquid reservoir; and
   an electromagnetic field generator configured to generate an electromagnetic field in the liquid supply tube, and
   wherein part of the liquid supply tube is immersed in the liquid received in the liquid reservoir and the electromagnetic field generator is provided in the liquid reservoir wherein an area of the liquid supply tube that is immersed in the liquid received in the liquid reservoir includes:
   a first tubular portion through which the processing liquid flows upward;
   a second tubular portion that is connected to the first tubular portion and through which the processing liquid flows in a different direction from the first tubular portion; and
   a third tubular portion that is connected to the second tubular portion and through which the processing liquid flows downward, and
   wherein the electromagnetic field generator disposed only on the third tubular portion.

7. The liquid supply unit of claim 6, wherein the part of the liquid supply tube immersed in the liquid received in the liquid reservoir is provided in a zigzag form.

8. The liquid supply unit of claim 6, further comprising:
   a filter installed in the liquid supply tube and configured to filter impurities from the processing liquid to be supplied to the nozzle,
   wherein the ultrasonic-wave application member is disposed upstream of the filter.

9. The liquid supply unit of claim 6, wherein the processing liquid includes a chemical or an organic solvent,
   wherein the chemical is sulfuric acid, hydrofluoric acid, or a mixture thereof, and
   wherein the organic solvent is isopropyl alcohol.

\* \* \* \* \*